United States Patent
Lee

(10) Patent No.: US 7,329,570 B2
(45) Date of Patent: Feb. 12, 2008

(54) METHOD FOR MANUFACTURING A SEMICONDUCTOR DEVICE

(75) Inventor: Kyung-Ho Lee, Goyang (KR)

(73) Assignee: Dongbu Electronics Co., Ltd., Seoul (KR)

( * ) Notice: Subject to any disclaimer, the term of this patent is extended or adjusted under 35 U.S.C. 154(b) by 34 days.

(21) Appl. No.: 11/319,814

(22) Filed: Dec. 27, 2005

(65) Prior Publication Data
US 2006/0141714 A1    Jun. 29, 2006

(30) Foreign Application Priority Data
Dec. 29, 2004    (KR)    ........................ 10-2004-0115641

(51) Int. Cl.
H01L 21/8238    (2006.01)
H01L 21/8249    (2006.01)

(52) U.S. Cl. ..................... 438/199; 438/202; 438/207; 438/217; 438/234; 438/232; 257/341; 257/343; 257/370; 257/371; 257/395; 257/E21.634; 257/E21.639

(58) Field of Classification Search ................ 438/199, 438/202, 207, 217, 234, 275, 232; 257/341, 257/343, 370–371, 395, 500, 502
See application file for complete search history.

(56) References Cited

U.S. PATENT DOCUMENTS

| | | | | |
|---|---|---|---|---|
| 5,156,989 A | * | 10/1992 | Williams et al. | ............. 438/206 |
| 5,374,569 A | * | 12/1994 | Yilmaz et al. | ............... 438/203 |
| 5,485,027 A | * | 1/1996 | Williams et al. | ............. 257/343 |
| 5,559,044 A | * | 9/1996 | Williams et al. | ............. 438/234 |
| 6,124,157 A | | 9/2000 | Rahim | |
| 6,127,213 A | * | 10/2000 | Tung | ........................ 438/202 |
| 6,207,991 B1 | | 3/2001 | Rahim | |
| 6,404,011 B2 | * | 6/2002 | Kim et al. | .................. 257/341 |
| 2004/0256658 A1 | * | 12/2004 | Park et al. | .................. 257/315 |
| 2005/0189606 A1 | * | 9/2005 | Nakagawa | .................. 257/500 |
| 2005/0258496 A1 | * | 11/2005 | Tsuchiko | ..................... 257/378 |
| 2006/0017114 A1 | * | 1/2006 | Chen et al. | ................. 257/371 |
| 2006/0030107 A1 | * | 2/2006 | Huang et al. | ............... 438/275 |
| 2006/0099753 A1 | * | 5/2006 | Chen et al. | ................. 438/199 |

* cited by examiner

FOREIGN PATENT DOCUMENTS

KR    2003-0050357    6/2003

OTHER PUBLICATIONS

Byeong Ha Lee; Method for Fabricating Bipolar-CMOS-DMOS Device; Korean Patent Abstracts; Publication No. 1020030050357 A; Publication Date: Jun. 25, 2003; Korean Intellectual Property Office, Republic of Korea.

*Primary Examiner*—Michael Lebentritt
*Assistant Examiner*—Mohsen Ahmadi
(74) *Attorney, Agent, or Firm*—Andrew D. Fortney

(57) ABSTRACT

An exemplary method of manufacturing a semiconductor device according to an embodiment of the present invention includes forming a P-well and an N-well for high voltage (HV) devices and a first well in a low voltage/medium voltage (LV/MV) region for a logic device, in a semiconductor substrate; simultaneously forming a second well in the LV/MV region for a logic device and a drift region for one of the HV devices using the same mask; and respectively forming gate oxide layers on the semiconductor substrate in the HV/MV/LV regions. According to the present invention, the number of photolithography processes can be reduced by replacing or combining an additional mask for forming an extended drain region of a high voltage depletion-enhancement CMOS (DECMOS) with a mask for forming a typical well of a logic device, so productivity of the total process of the device can be enhanced.

12 Claims, 6 Drawing Sheets

METHOD FOR MANUFACTURING A SEMICONDUCTOR DEVICE

CROSS-REFERENCE TO RELATED APPLICATION

This application claims priority to and the benefit of Korean Patent Application No. 10-2004-0115641, filed in the Korean Intellectual Property Office on Dec. 29, 2004, the entire contents of which are incorporated herein by reference.

BACKGROUND OF THE INVENTION (a) Field of the Invention

The present invention relates to a method of manufacturing a semiconductor device. In more detail, the present invention relates to a method of manufacturing a semiconductor device (including a combination of high voltage (HV) depletion-enhancement CMOS (DECMOS) devices and logic devices) that is capable of simultaneously forming medium voltage (MV) and high voltage devices.

(b) Description of the Related Art

In a process for manufacturing a liquid crystal display driver integrated circuit (LCD Driver IC, or LDI) according to a conventional art, a controller IC, a source driver IC, and a gate driver IC are usually formed as a three-chip solution or a two-chip solution.

Recently, a one-chip solution for mobile communication systems has been developed, so an advanced manufacturing method for a merged or combined process that can simultaneously form a semiconductor device for high voltage (HV) operation, for medium voltage (MV) operation, and for low voltage (LV) operation is needed and/or desired.

In a current level of semiconductor processes, a conventional process for a logic device and that for a high voltage operation device are separately performed in the merged or combined process, so the number of masks for the integrated solution (i.e., containing HV, MV and LV devices) is the same or larger. That is, although a junction that is used for the HV device is the same type as the logic device (the MV or LV device), separate photolithography processes for forming those junctions are performed.

In addition, a mask for forming a channel stop layer (typically used for isolating the HV operation device region) and masks for the typical process for a logic device are separately used. This is because the thermal budget for the high voltage operation device cannot be applied to the process for making a low voltage or a medium voltage operation device.

FIG. 1 is a cross-sectional view showing a semiconductor device formed with an NMOS drift region Ndrift (e.g., 116) and a PMOS drift region Pdrift (e.g., 117) in an HV device, made according to a conventional photolithography process using of separate masks. Referring to FIG. 1, in the conventional process for making the semiconductor device, additional masks are used for forming an Ndrift region (e.g., 116) and a Pdrift region (e.g., 117) in an HV region.

In more detail, a P-well 113 and an N-well 114 for an HV operation device, and an N-Well 115 for a logic device, are formed in a P-type semiconductor substrate 111, and then an Ndrift region 116 and a Pdrift region 117 for the HV operation device are formed using a different mask from that used for forming a P-well 118 and an N-well 119 for the logic device. Reference numerals 112a to 112d denote isolation layers, 120a denotes an LDD region, 121a, 122a, and 122b denote source/drain regions, 123a denotes a gate, and 124a denotes a silicide layer.

As described above, in the conventional method of manufacturing a semiconductor device, an additional mask for forming a drift region of high voltage (HV) DECMOS device is used, so the number of masks in the full process may be the same or increased.

The above information disclosed in this Background section is only for enhancement of understanding of the background of the invention, and therefore, it may contain information that does not form prior art or other information that is already known in this or any other country to a person of ordinary skill in the art.

SUMMARY OF THE INVENTION

The present invention has been made in an effort to provide a method of manufacturing a semiconductor device having advantages of reducing mask steps by using the same mask to form a drift region for an HV device and a well for a logic device.

An exemplary method of manufacturing a semiconductor device according to an embodiment of the present invention includes forming a P-well and an N-well for high voltage (HV) operation devices, and a first well in a low voltage/medium voltage (LV/MV) region for a logic device in a semiconductor substrate; simultaneously forming a second well in the LV/MV region for a logic device and a drift region for one of the HV devices using a same mask; and respectively forming gate oxide layers on the semiconductor substrate in the HV/MV/LV regions.

In a further embodiment, the mask used to form the drift region for the HV device may be the same mask as that used to form the second well of the logic device.

In a further embodiment, in simultaneously forming the second well in the LV/MV region for the logic device and the drift region for the HV device, an N-well of the second well and an NMOS drift region may be simultaneously formed, and a P-well of the second well and a PMOS drift region may be simultaneously formed.

In a further embodiment, forming a gate oxide for the HV device may comprise a chemical vapor deposition process.

After the gate oxide for the HV device is formed, the second well for a logic device and the drift region for an HV device may be formed using a same mask.

The second well of the LV/MV region for the logic device may be simultaneously formed in the process of forming the drift region for an HV device.

In a further embodiment, the gate oxide layers on the semiconductor substrate in the HV/MV/LV regions may be formed by a triple oxide process, wherein gate oxides for an LV device, an MV device, and an HV device are simultaneously formed.

According to the present invention, an additional mask that was conventionally employed for forming the extended drain region of the HV DECMOS device is replaced with a mask for forming a logic well. Therefore, the extended drain region and the logic well may be simultaneously formed in a single process with the use of the same mask, and the number of masks and relevant processing steps may be reduced. Consequently, productivity of the total process of the device can be enhanced and/or the total time of manufacturing can be reduced. In addition, in an LCD Driver IC (LDI) process wherein devices for HV/MV/LV operation are merged or combined, a one-chip solution can replace a two-chip or three-chip solution, so the process can be simplified. Therefore, the cost of the semiconductor device can be reduced.

DETAILED DESCRIPTION OF THE EMBODIMENTS

Figure 1:
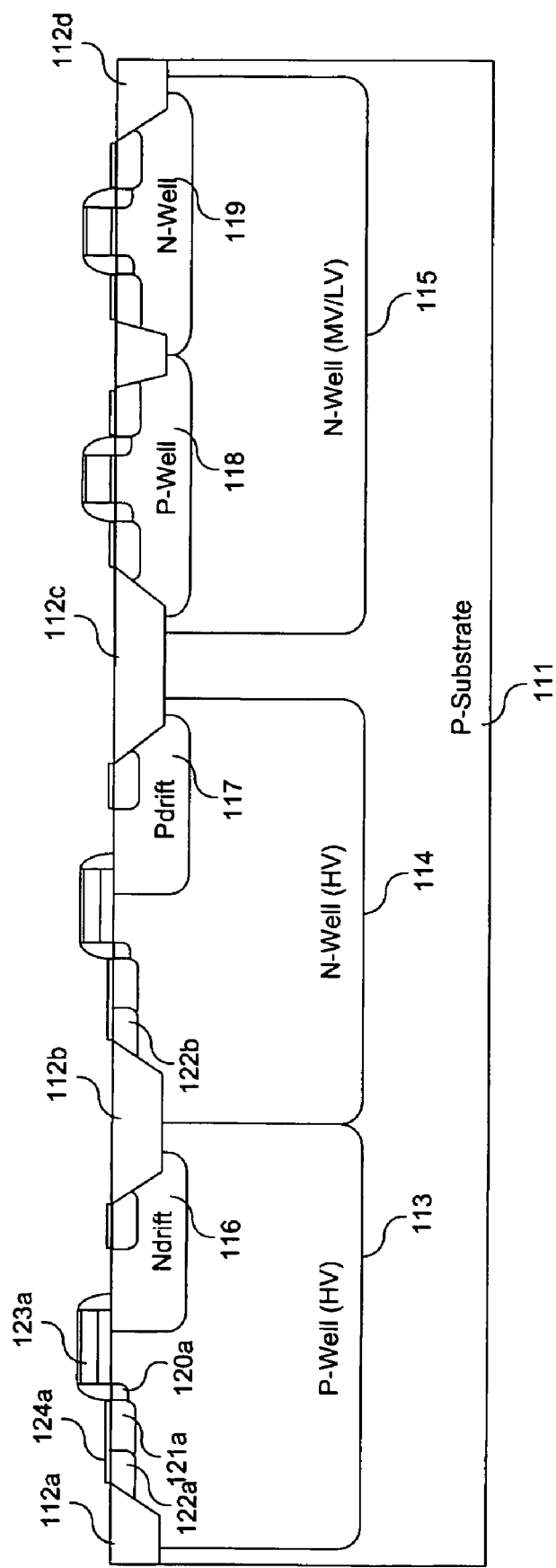
FIG. 1 is a cross-sectional view showing a HV semiconductor device that is conventionally formed.

An exemplary embodiment of the present invention will hereinafter be described in detail with reference to the accompanying drawings.

Recently, a conventional process for forming a high voltage (HV) semiconductor device (and/or one or more junctions thereof has been replaced with a simultaneous process for forming a retrograde well by high energy ion implantation.

In a semiconductor device for a one-chip solution IC used for driving a display panel (e.g., a thin film transistor (TFT) LCD, an organic light emitting diode (OLED), etc.), a device configured to operate at low voltage (a so-called LV device), a device configured to operate at medium voltage (a so-called MV device), and a device configured to operate at high voltage (a so-called HV device) are desired for a panel driver or for constituent elements in such a one-chip solution IC. Although not limited to any particular operational voltages, the LV device may operate in a range of from 0 to 5 V (i.e., using a power supply of from 1.8 to 5.0 V), the MV device may operate in a range of from 0 to 12 V (i.e., using a power supply of from 5 to 12 V), and the HV device may operate in a range of from 0 to 200 V (i.e., using a power supply of from 12 to 40 V). In any case, the operating voltage of the HV device is higher than the operating voltage of the MV device, which in turn is higher than the operating voltage of the LV device.

In such a process, a process for the HV device requiring a high thermal budget is generally formed first, and a process for the LV device and the MV device generally follows. At this time, in order to obtain certain predetermined characteristics for the HV device, a drain region having a low dopant concentration, that is, an extended drain or a drift region, should be formed.

In an HV CMOS device requiring an operating voltage of under 12V, a double diffused drain (DDD) structure may be formed by using a difference of diffusivity of dopants and a self-align without an additional mask. However, as an operating voltage of a panel increases, for example to over 20V, an additional mask may be used to form the extended drain region.

In a TFT LCD driver IC, a source driver and a gate driver may each independently function as a driving device. For example, the gate driver may drive a very high voltage, for example up to 40V.

A two-chip or three-chip solution is typical for realizing the high voltage device in a system. However, recently, a small TFT LCD driver IC such as a TFT LCD for a mobile phone has been manufactured in a one-chip solution.

An exemplary embodiment of the present invention can be used to minimize the mask set for a process of manufacturing a system on chip (SOC) IC, where each type of device (HV, MV and LV) is present on the chip/IC. That is, the extended drain in an HV region may be replaced by (or made at the same time as) a retrograde well in a logic device.

A retrograde well process enables precisely controlled implantation (e.g., high energy ion implantation) without a thermal diffusion process, so lateral diffusion can be reduced or suppressed. Therefore, the retrograde well process with high energy ion implantation has a merit of suppressing lateral diffusion of impurities so as to facilitate formation of a smaller and/or highly integrated device.

Here, "retrograde" indicates a doping profile of the implanted impurities in a P-well or an N-well. The impurity concentration is highest not in a shallow portion beneath the substrate surface but rather at a certain distance from the substrate surface. In order to form such a doping profile, a first well in the deep portion under the substrate surface is formed by impurity (or ion) implantation with a relatively high concentration, and a second well in the shallow portion beneath the substrate surface is formed by impurity (or ion) implantation with a relatively low concentration (and, preferably, a low energy relative to the deep implant). At this time, a high energy ion implantation method may precisely control the doping profile under the substrate surface.

Figure 2:
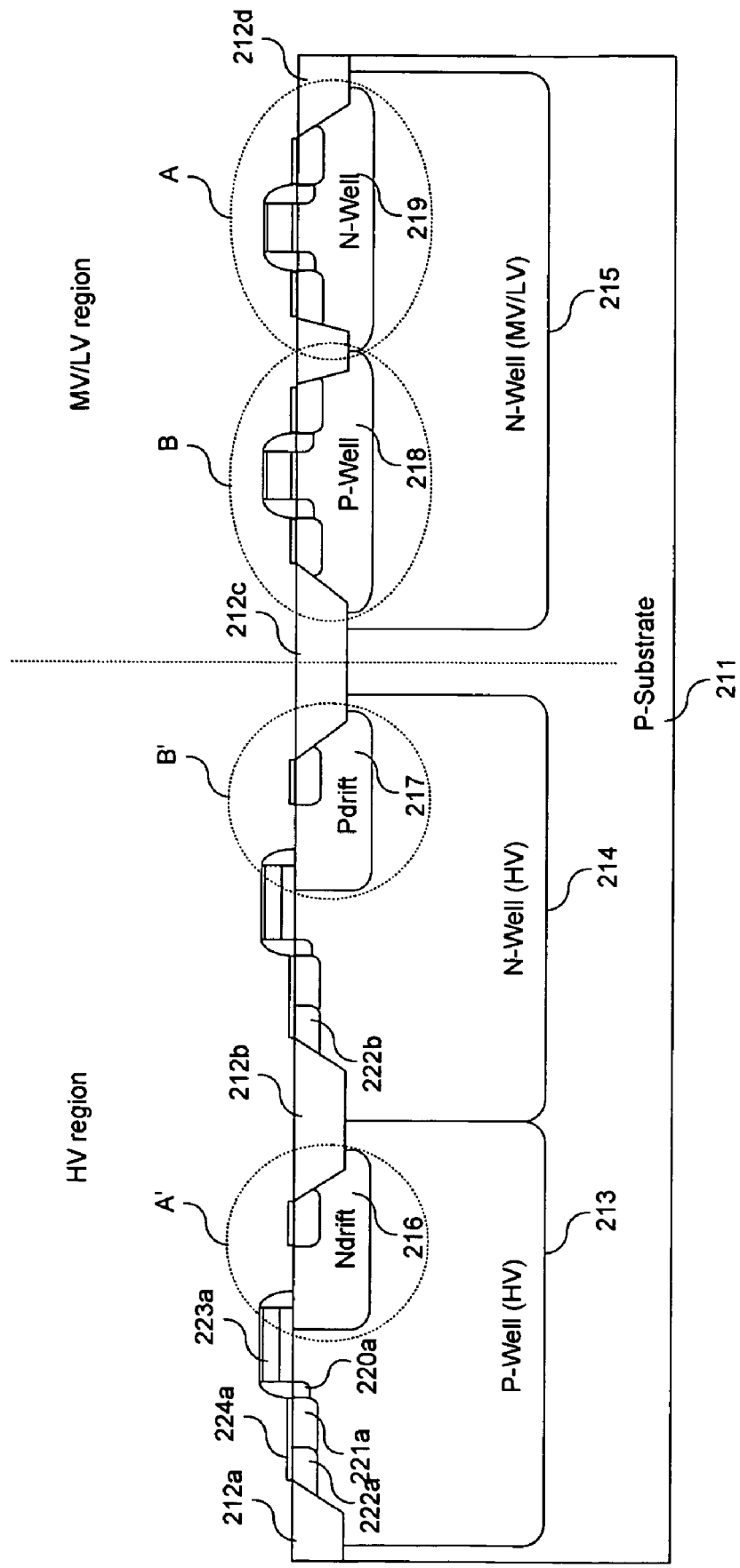
FIG. 2 is a cross-sectional view showing a semiconductor device that is formed by an exemplary embodiment of the present invention.

FIG. 2 is a cross-sectional view showing a semiconductor device that is formed by an exemplary embodiment of the present invention. An NMOS drift (Ndrift) region in an HV region of the substrate may be formed simultaneously with one or more well regions in a LV and/or MV region of the substrate using a (second) well mask. Separately, a PMOS drift (Pdrift) region in an HV region of the substrate may be formed simultaneously with one or more well regions in a LV and/or MV region of the substrate using a separate well mask.

According to an exemplary embodiment of the present invention, an additional mask that was conventionally employed for forming the extended drain region of the HV DECMOS device may be replaced or combined with a mask for forming a logic well. Therefore, the extended drain region and the logic well may be simultaneously formed in a single process with the same mask, and the number of masks and relevant processing steps may be reduced.

Referring to FIG. 2, in a semiconductor device according to the exemplary embodiment of the present invention, each of the Ndrift and the Pdrift regions in the HV region are formed simultaneously with a second well region (e.g., P-well 218 or N-well 219) in the LV/MV region(s), using the same mask.

In more detail, a P-well 213 for an HV device, an N-well 214 for another HV device, and an N-well 215 as a first well for an LV and/or MV device are formed on a P-type semiconductor substrate 211. Alternatively, if the substrate is an N-substrate, N-well 215 may be replaced by a (lightly doped) P-well in the LV and/or MV region(s). Furthermore, if the substrate comprises an intrinsic semiconductor wafer, then either an N-well (similar or identical to N-well 215) or a (lightly doped) P-well may be used (although neither would be absolutely necessary). N-well 214 for an HV device and N-well 215 for an LV and/or MV device are generally not formed at the same time, since the dopant doses, implant energies and even specific dopants (e.g., P vs. a combination of P and As) nay differ between the two N-wells 214 and 215.

Then, an Ndrift region 216 for the HV device and an N-well 219 for the logic device are simultaneously formed using the same mask. Thus, the dopant, dose, and implant energy is essentially the same for Ndrift region 216 and N-well 219. In addition, a Pdrift region 217 for the HV device and a P-well 218 for the logic device are simultaneously formed using the same mask. Thus, the dopant, dose, and implant energy is essentially the same for Pdrift region 217 and P-well 218. That is, the high voltage (HV) drift regions 216 and 217 use the same junction as the second wells 219 and 218 of the logic device, respectively. Regions shown by reference numeral A and A' are formed using the same mask, and regions shown by reference numeral B and B' are formed using another (but the same other) mask. Reference numerals 212a to 212d denote isolation layers, 220a denotes an LDD region, 221a, 222a, and 222b denote source/drain regions, 223a denotes a gate electrode, and 224a denotes a silicide layer.

FIG. 3A to FIG. 3D are cross-sectional views showing principal stages of a semiconductor device according to an exemplary embodiment of the present invention.

Figure 3A:
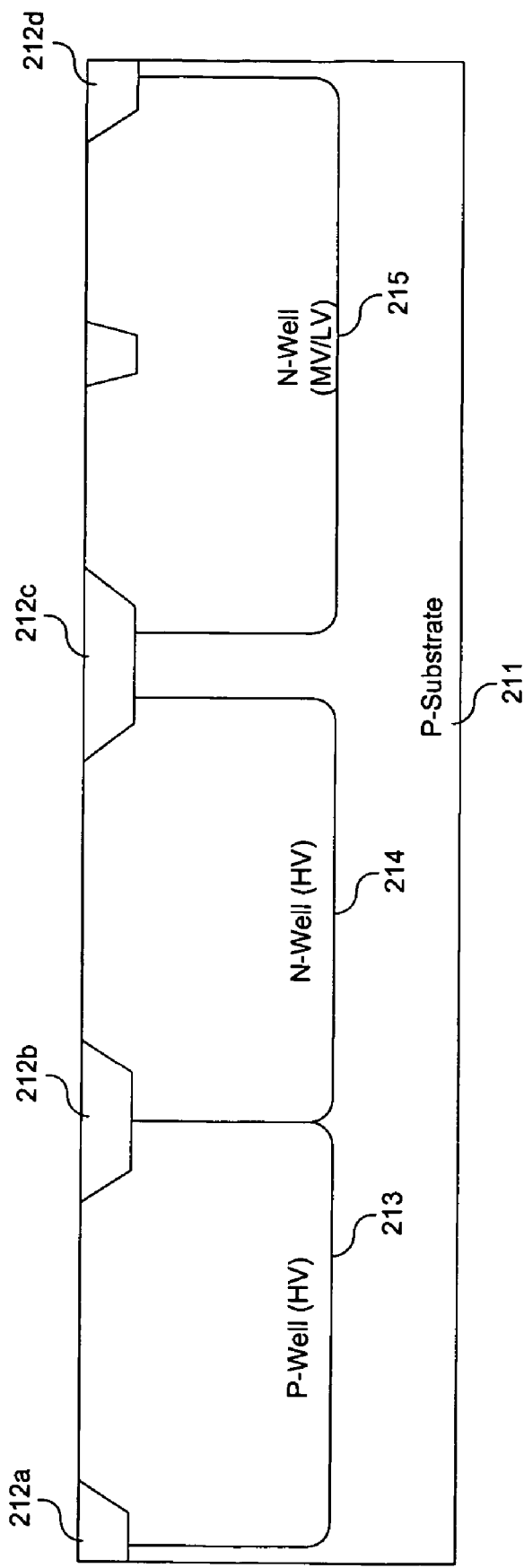
FIG. 3A to FIG. 3D are cross-sectional views showing principal stages of a semiconductor device manufacturing method according to an exemplary embodiment of the present invention.

Referring to FIG. 3A, isolation layers 212a, 212b, 212c, and 212d are formed on or in a P-type semiconductor substrate 211. The isolation structures 212a, 212b, 212c, and 212d may each comprise a shallow trench isolation (STI) structure and/or a LOCOS (local oxidation of silicon) structure. A P-well 213 and an N-well 214 for an HV device are formed in the substrate 211 (generally by ion implantation), then the P-well 213 and an N-well 214 may be annealed in a manner consistent with conventional well implant annealing for HV devices, and a first N-well 215 for an LV and/or MV device is formed (also by ion implantation) in a logic device region of the substrate 211, then the N-well 215 may be annealed in a manner consistent with conventional well implant annealing for LV and/or MV devices.

Figure 3B:
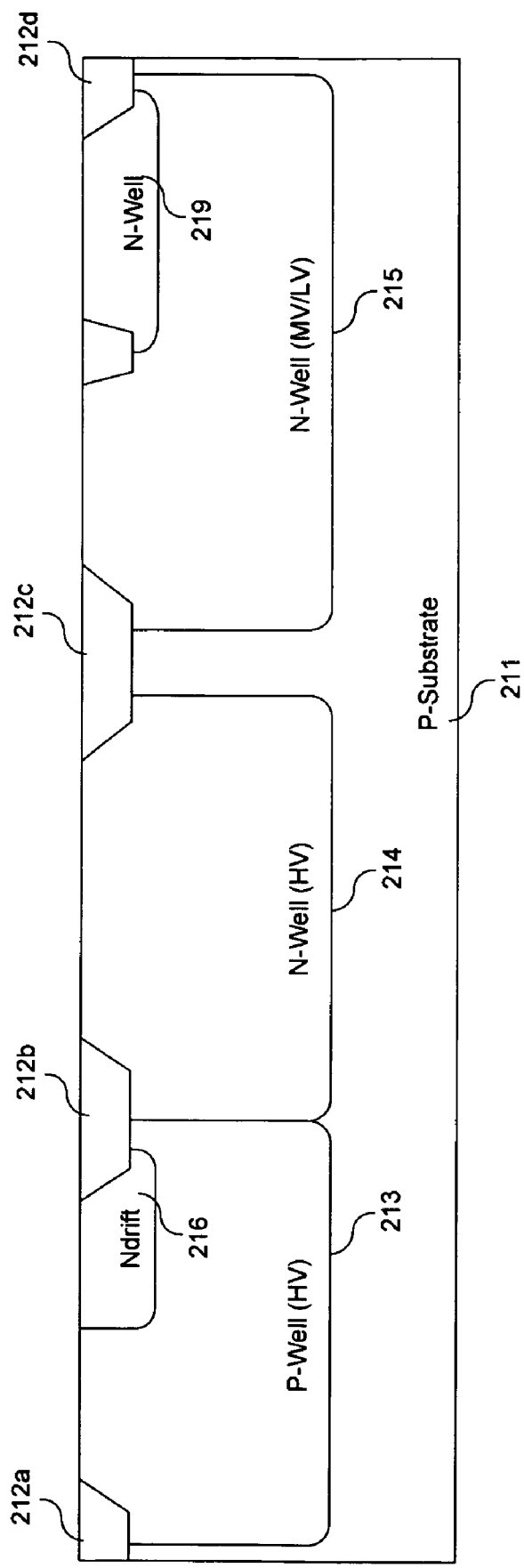
Figure 3C:
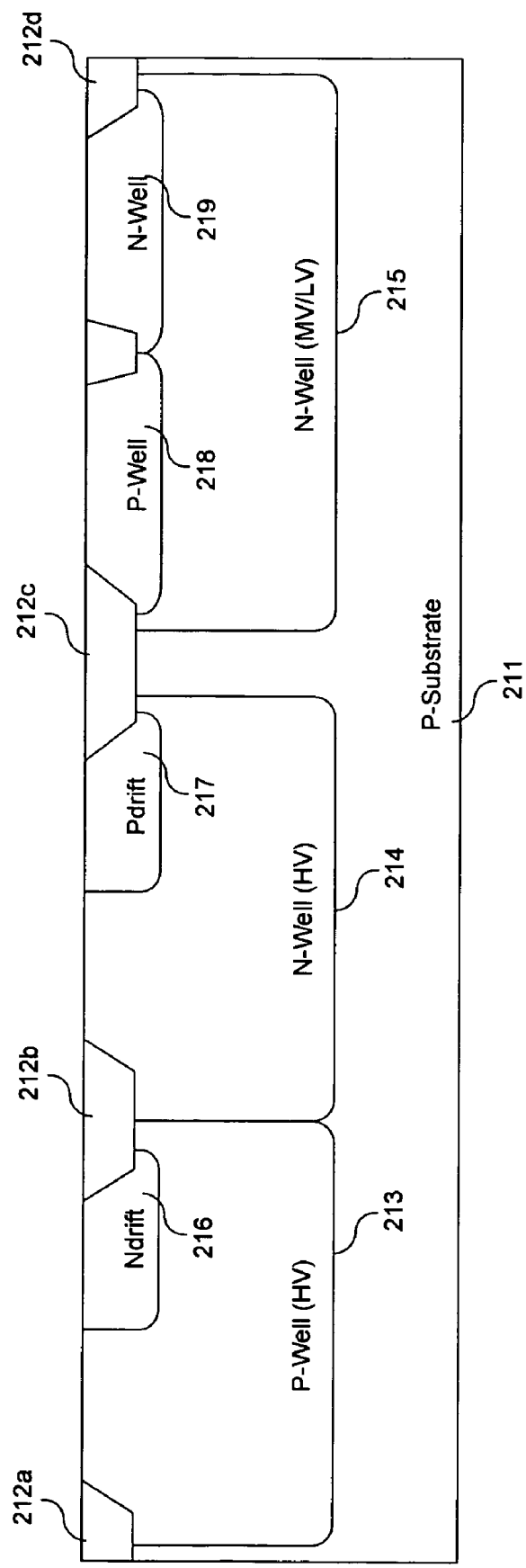

Subsequently, referring to FIG. 3B, an Ndrift region 216 for the HV device and an N-well 219 for the logic device are simultaneously formed using the same mask. In addition, referring to FIG. 3C, a Pdrift region 217 for the HV device and a P-well 218 for the logic device are simultaneously formed using the same mask. Thereafter, the Ndrift region 216, Pdrift region 217, P-well 218, and N-well 219 may be annealed in a manner consistent with conventional annealing for shallow well annealing in LV and/or MV devices. The process order discussed above with regard to FIG. 3B and FIG. 3C can be varied.

Figure 3D:
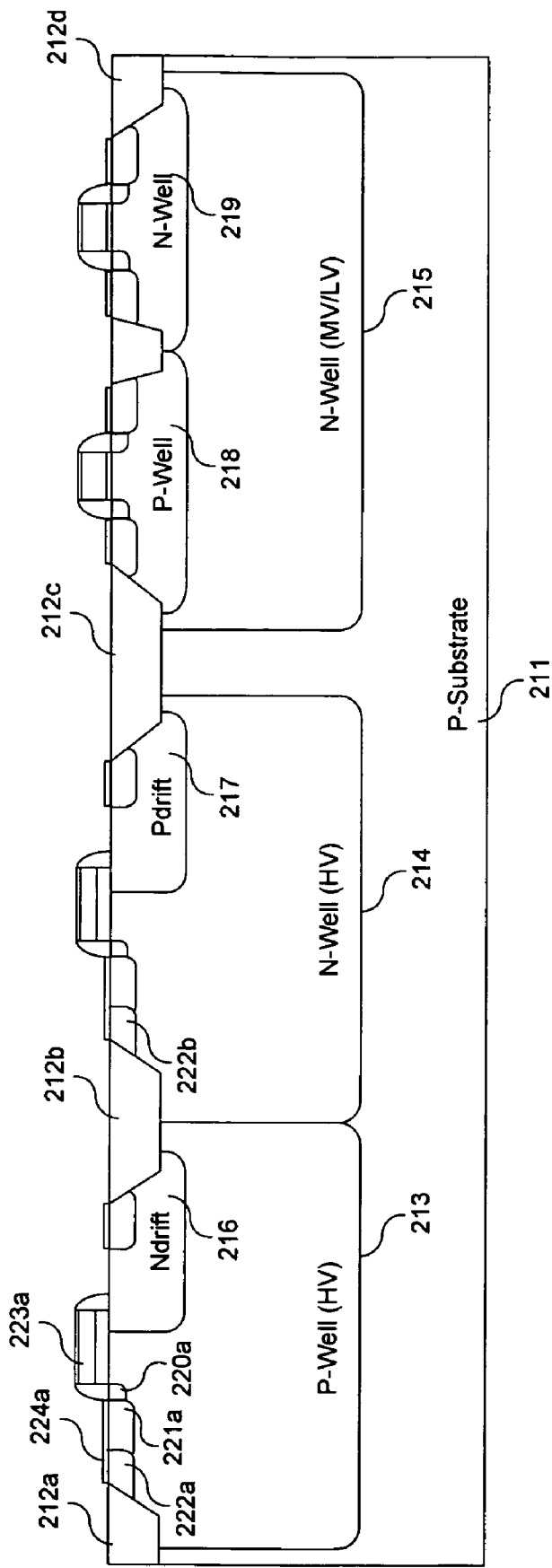

Referring to FIG. 3D, a gate 223a, an LDD region 220a, source/drain regions 221a, 222a, and 222b, and a silicide layer 224a are sequentially formed in a typical method.

Here, a gate oxide layer for the high voltage (HV) device can be formed (or at least a first part of the HV device gate oxide can be formed) by CVD at a relatively low temperature. As an alternative to the process order described above, the drift region and the second well of the MV and/or LV region devices can be formed after forming the HV gate oxide layer (e.g., a CVD oxide layer). That is, the second well of the logic circuit region is formed at the same time as the drift region for an HV device.

In addition, for simplifying the process, the gate oxide layers may be formed by a triple oxide process wherein three gate oxides for an LV device, an MV device, and an HV device, each having a different thickness, are formed in a one-step process. The triple oxide process denotes a method wherein oxide layers in a substrate are formed to three different thicknesses depending on the operating voltage (i.e., HV, MV, and LV) of each device. This process may comprise wet or dry thermal oxidation, using rapid thermal processing (RTP). In such a process, the substrate may be doped differently in the first, second and third devices, and the different doping (e.g., dopant types and/or doses) may give rise to differential growth rates of the gate oxide in each device. To obtain greater differences in gate oxide thicknesses, the gate oxide(s) may be etched back (at substantially the same rate) using wet etching (e.g., using dilute aqueous HF or a conventional buffered oxide etch solution) and re-grown until the desired thicknesses are achieved. Alternatively, the different gate oxides can be grown or deposited one at a time, with the first gate oxide being formed for a subset of devices while the remaining devices are masked, then the device areas including the first gate oxide are masked while the second gate oxide is formed in another subset of devices.

According to an exemplary embodiment of the present invention, an additional mask that was conventionally employed for forming the extended drain region of the HV DECMOS device (e.g., the Ndrift implant 216 or the Pdrift implant 217) is replaced or combined with a mask for forming a logic well. Therefore, the extended drain region and the logic well may be simultaneously formed in a single process step (or single set of process steps) with the use of the same mask, and the number of masks and relevant process steps may be reduced.

In addition, in an LCD Driver IC (LDI), where devices for HV, MV, and LV operation are combined and/or merged, a one-chip solution can replace a two-chip or three-chip solution, so the process can be simplified. Consequently, the total cost of the semiconductor device solution can be reduced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a semiconductor device, comprising:

forming a P-well and an N-well in a high voltage (HV) region for a plurality of high voltage devices;

forming a first well in a low voltage and/or medium voltage (LV/MV) region of a semiconductor substrate for one or more logic devices;

simultaneously forming a second well in the LV/MV region for one of the one or more logic devices and a drift region in the HV region for one of the HV devices using the same mask; and forming one or more gate oxide layers on the semiconductor substrate in the HV, MV and LV regions.

2. The method of claim 1, wherein the one or more logic devices comprises a plurality of logic devices, and the method further comprises simultaneously forming a third well in the LV/MV region for a second one of the logic devices and a drift region for a second one of the HV devices using the same mask.

3. The method of claim 1, wherein simultaneously forming the second well in the LV/MV region for the logic device(s) and the drift region for the HV device comprises forming an N-well and an NMOS drift region.

4. The method of claim 3, further comprising simultaneously forming a P-well in the LV/MV region for a second logic device and a PMOS drift region for a second one of the HV devices.

5. The method of claim 1, wherein forming gate oxide layers comprises forming a gate oxide for the HV devices by chemical vapor deposition.

6. The method of claim 5, wherein, after the gate oxide for the HV operation device is formed, the second well for a logic device and the drift region for the HV device are formed using the same mask.

7. The method of claim 6, further comprising simultaneously forming a third well in the LV/MV region for a second logic device and a drift region for a second one of the HV devices.

8. The method of claim 1, wherein forming the gate oxide layer(s) comprises a triple oxide process, wherein a first gate oxide for an LV device, a second gate oxide for an MV device, and a third gate oxide for an HV device are simultaneously formed.

9. The method of claim 1, further comprising forming a plurality of gates on the gate oxide layer(s).

10. The method of claim 9, further comprising forming one or more source/drain regions in the substrate adjacent to each of the gates.

11. The method of claim 10, further comprising forming one or more source/drain regions in the substrate in a predetermined location apart from each of the gates of the HV devices.

12. The method of claim 11, wherein the semiconductor device comprises a plurality of LV devices, a plurality of MV devices, and a plurality of HV devices.

* * * * *